United States Patent [19]
Yokotani et al.

[11] Patent Number: 5,621,320
[45] Date of Patent: Apr. 15, 1997

[54] MAGNETORESISTANCE TYPE SENSOR DEVICE FOR DETECTING CHANGE OF MAGNETIC FIELD

[75] Inventors: Masahiro Yokotani; Fumito Uemura; Wataru Fukui, all of Himeji, Japan

[73] Assignee: Mitsubishi Denki Kabushiki Kaisha, Tokyo, Japan

[21] Appl. No.: 534,937

[22] Filed: Sep. 28, 1995

[30] Foreign Application Priority Data

Mar. 3, 1995 [JP] Japan .................................. 7-044427

[51] Int. Cl.$^6$ ............................ G01R 33/09; H01L 43/02
[52] U.S. Cl. ........................................ 324/252; 338/32 R
[58] Field of Search ........................... 324/207.12, 207.2, 324/207.21, 207.25, 251, 252; 338/32 R, 32 H

[56] References Cited

U.S. PATENT DOCUMENTS

| | | | |
|---|---|---|---|
| 4,596,950 | 6/1986 | Lienhard et al. | 324/252 X |
| 4,845,456 | 7/1989 | Abe et al. | 338/32 R |
| 5,055,781 | 10/1991 | Sakakibara et al. | 324/207.21 |
| 5,216,363 | 6/1993 | Masaaki | 324/207.21 |
| 5,500,590 | 3/1996 | Pant | 324/252 |

FOREIGN PATENT DOCUMENTS 3282277  12/1991  Japan .
4369278  12/1992  Japan .

Primary Examiner—Sandra L. O'Shea
Assistant Examiner—Roger Phillips
Attorney, Agent, or Firm—Sughrue, Mion, Zinn, Macpeak & Seas

[57] ABSTRACT

A magnetoresistance type sensor device for detecting an angle or strength of a magnetic field applied thereto includes first to fourth magnetoresistance elements interconnected so as to constitute a Wheatstone bridge circuit, and a differential amplifier circuit having inputs for receiving a first potential from a first junction formed between a pair of elements and a second potential from a second junction formed between paired elements for thereby generating a differential amplitude voltage signal indicative of the angle or strength of the magnetic field. The magnetoresistance elements are formed of a material having a same composition and dimensioned such that change of the resistance of the first and second magnetoresistance elements brought about by a change in the angle or strength of the applied magnetic field differs from corresponding change of the resistance of the third and fourth magnetoresistance elements, and that the changes of the resistances of the first and second magnetoresistance elements are equal to each other with the changes of resistances of the third and fourth magnetoresistance elements being equal to each other. The temperature characteristics of the magnetoresistance elements are equalized. The differential amplitude voltage signal generated by the differential amplifier is compensated for in respect to the temperature variations.

8 Claims, 3 Drawing Sheets

MAGNETORESISTANCE TYPE SENSOR DEVICE FOR DETECTING CHANGE OF MAGNETIC FIELD

BACKGROUND OF THE INVENTION

1. Field of the Invention

The present invention relates to a magnetoresistance type sensor device for detecting a change of an angle or strength of an applied magnetic field in terms of an electric signal by using magnetoresistance elements interconnected in the form of a Wheatstone bridge circuit. More particularly, the present invention is concerned with improvement of the magnetoresistance type sensor device such that the output signal thereof is made to be substantially immune to the influence of variations in the ambient temperature by compensating for temperature characteristics of the magnetoresistance elements. The magnetoresistance type sensor device according to the invention can find profitable applications for detection of an angular position or displacement (stroke) of a member such as, for example, a steering column of a motor vehicle and others with high accuracy and reliability. Parenthetically, it should first be mentioned that with the phrase "magnetoresistance element", it is intended to mean circuit elements whose electric resistance or whose voltage generated thereacross changes in dependence on an angle at which a magnetic field is applied or strength thereof and encompass a ferromagnetic thin-film element made of a magnetic material having considerably high permeability such as Ni-Co., a Hall element and the like.

2. Description of Related Art

The magnetoresistance type sensor devices mentioned above are well known in the art, and they are generally so designed as to generate a signal indicative of an angular position and/or displacement of a member being monitored with the aid of magnetoresistance elements which are interconnected in the form of a Wheatstone bridge circuit and whose resistances vary in response to change in an angle or strength of a magnetic field applied externally from a permanent magnet or the like element provided in association with the member of concern.

Before entering into description of the present invention, background techniques will be explained in some detail for having a better understanding of the invention.

FIG. 3 is a circuit diagram showing a conventional magnetoresistance type sensor device known heretofore and employed generally for detecting an angular position, a stroke or displacement of a member of concern, and FIG. 4 is a view for illustrating disposition and patterns of magnetoresistance elements employed in the magnetoresistance type sensor device shown in FIG. 3 together with a magnetic field applied to the device.

Referring to FIG. 3, the magnetoresistance type sensor device includes a Wheatstone bridge circuit 1 which is comprised of first to fourth magnetoresistance elements RA, RB, RC and RD. As the magnetoresistance elements RA, RB, RC and RD, there may be used a ferromagnetic thin-film element made of a magnetic material having considerably high permeability such as Ni-Fe, Ni-Co, etc., a semiconductor magnetoresistance element, a Hall element and the like, as mentioned previously. In the following description, it is however assumed that the ferromagnetic thin-film magnetoresistance element is employed. It should further be mentioned that a constant current circuit is provided for supplying a constant current to the Wheatstone bridge circuit 1, although it is not shown in FIG. 3.

The magnetoresistance elements RA and RB are interconnected at a junction P1 (neutral point), the magnetoresistance elements RC and RD are connected together at a junction P2 (neutral point) and the magnetoresistance elements RA and RC are interconnected at a junction P3 with the magnetoresistance elements RB and RD being interconnected at a junction P4, wherein the junctions P1 and P2 constitute output terminals of the Wheatstone bridge circuit 1, while the junction P3 is connected to a power source $V_{cc}$ with the junction P4 being connected to the ground potential. In FIG. 3, reference character V1 represents a potential at the junction P1 with V2 representing a potential at the junction P2.

A differential amplifier circuit 2 is connected to the junctions P1 and P2 constituting the output terminals of the Wheatstone bridge circuit 1 and has an inverting input terminal (−) to which the potential V1 of the junction P1 is applied and a non-inverting input terminal (+) to which the potential V2 of the junction P2 is applied.

Further, the non-inverting input terminal (+) of the differential amplifier circuit 2 is connected to a junction between variable voltage divider resistors R1 and R2 which are connected in series and inserted between the ground potential and the power source $V_{cc}$ so that a reference voltage for the potential V2 is applied to the non-inverting input terminal (+) of the differential amplifier circuit 2. Thus, there is finally obtained a differential amplitude voltage signal V0 from the magnetoresistance type sensor device, which signal indicates changes in an angle at which an external magnetic field is applied to the magnetoresistance type Wheatstone bridge circuit or change in the strength of the applied magnetic field.

Next reference is made to FIG. 4. In this figure, reference characters 1, RA to RD and P1 to P4 denote the parts which are equivalent to those denoted by same reference characters in FIG. 3. As can be seen in FIG. 4, the magnetoresistance elements RA to RD are each deposited in a zigzag pattern and disposed in juxtaposition to one another on a same plane of a substrate. In this conjunction, it is to be noted that the zigzag patterns of the magnetoresistance elements RA and RB connected to each other at the junction P1 (constituting the first output terminal of the Wheatstone bridge circuit 1) extend in the directions opposite to each other (i.e., symmetrically relative to a vertical center line extending through the junctions P1 and P2 of the Wheatstone bridge circuit 1, as viewed in FIG. 4). The zigzag patterns of the magnetoresistance elements RC and RD which are connected together at the junction P2 constituting the second output terminal of the Wheatstone bridge circuit 1 are also disposed similarly to the magnetoresistance elements RA and RD.

On the other hand, the magnetoresistance elements RA and RD disposed diagonally opposite to each other are deposited in the same zigzag pattern. Similarly, the magnetoresistance elements RB and RC are deposited in a same zigzag pattern which extend in the directions orthogonally to those of the magnetoresistance elements RA and RD, respectively.

By virtue of the patterning and disposition of the magnetoresistance elements RA to RD described above, there make appearance at the junctions P1 and P2 the potentials V1 and V2 of the polarities opposite to each other, whereby a differential amplitude voltage signal (i.e., a voltage signal indicative of a difference between the potentials V1 and V2) is outputted from the Wheatstone bridge circuit 1.

Now, let's assume that an external magnetic field H is applied to the Wheatstone bridge circuit 1 at an angle θ, as illustrated in FIG. 4. Such magnetic field H may be generated by a permanent magnet of a sensor mounted on a rotatable member whose angle is to be detected, e.g. a steering column of a motor vehicle and applied to the Wheatstone bridge circuit 1 mounted stationarily in a predetermined orientation.

On the above assumption, operation of the conventional magnetoresistance type sensor device will now be elucidated by reference to FIGS. 3 and 4.

When the magnetic field H is applied to the magnetoresistance elements RA to RD of the Wheatstone bridge circuit 1, the resistance values of the magnetoresistance elements RA to RD will change in dependence on the change in the angle θ of the applied magnetic field.

Accordingly, the potentials V1 and V2 appearing at the junctions P1 and P2, respectively, will change in dependence on the change of the angle θ of the applied magnetic field. The potentials V1 and V2 are applied to the plus and minus input terminals of the differential amplifier circuit 2 to be thereby differentially amplified, which ultimately results in generation of the amplitude voltage signal V0 from the differential amplifier circuit 2.

On the basis of the differential amplitude voltage signal V0 generated in this way, it is possible to detect the angle of rotation, angular stroke or displacement or the like of a member being monitored (e.g. a steering column of a motor vehicle) in association with which the magnetoresistance type sensor device is provided.

In this conjunction, it is noted that the temperature coefficients of resistance of the magnetoresistance elements RA to RD which assume different resistance values in dependence on the angle θ of the applied magnetic field exert significant influence to the characteristic of the differential amplitude voltage signal V0 which is derived from the potentials V1 and V2 at the junctions P1 and P2 of the Wheatstone bridge circuit 1. This will be analyzed below.

In general, the resistance value R of each of the magnetoresistance elements RA to RD can be given by the following expression (1):

$$R = R_{min}\{1 + \alpha_{min}(T-25)\}\sin^2(\pi/4 - \theta) + R_{max}\{1 + \alpha_{max}(T-25)\}\cos^2(\pi/4 - \theta) \quad (1)$$

where $R_{min}$ represents a minimum resistance value which the magnetoresistance elements RA to RD can assume, $R_{max}$ represents a maximum resistance value which the magnetoresistance elements RA to RD can assume, $\alpha_{min}$ represents a minimum temperature coefficients of resistance of each of the magnetoresistance elements RA to RD, and $\alpha_{max}$ represents a maximum temperature coefficients of resistance of each of the magnetoresistance elements RA to RD, and T represents an ambient temperature on the assumption that the normal or room temperature is 25° C.

Now, let's suppose that the angle θ of the magnetic field applied to the magnetoresistance elements RA to RD changes within a range covering $(-)\pi/4$ to $(+)\pi/4$. Then, the terms "$\sin^2(\pi/4 - \theta)$" and "$\cos^2(\pi/4 - \theta)$" in the above expression (1) assume "1" or "0" for the maximum value and the minimum value of the angle θ of the magnetic field. In this case, the amplitude voltage signals Vs1 and Vs2 derived from the potentials V1 and V2 at the junctions P1 and P2, respectively, can be given by the undermentioned expressions (2) and (3), respectively.

$$Vs1 = V_{cc}[R_{min}\{1 + \alpha_{min}(T-25)\} - R_{max}\{1 + \alpha_{max}(T-25)\}]/ \quad (2)$$
$$\text{-continued}$$
$$[R_{min}\{1 + \alpha_{min}(T-25)\} + R_{max}\{1 + \alpha_{max}(T-25)\}]$$

$$Vs2 = -V_{cc}[R_{min}\{1 + \alpha_{min}(T-25)\} - R_{max}\{1 + \alpha_{max}(T-25)\}]/ \quad (3)$$
$$[R_{min}\{1 + \alpha_{min}(T-25)\} + R_{max}\{1 + \alpha_{max}(T-25)\}]$$

Now, the temperature characteristics of the amplitude voltage signals Vs1 and Vs2 will be considered. Magnitudes of change ΔVs1 and ΔVs2 of the amplitude voltage signals Vs1 and Vs2 for a temperature change ΔT (=T−25) from the room temperature (25° C.) to the ambient temperature T can be given by the following expressions (4) and (5), respectively.

$$\Delta Vs1 = V_{cc}\{2(T-25)(\alpha_{min} - \alpha_{max})R_{min} \cdot R_{max}\}/ \quad (4)$$
$$[\{1 + \alpha_{min}(T-25)\}R_{min}^2 + \{1 + \alpha_{max}(T-25)\}R_{max}^2 + \{2 + \alpha_{max}(T-25) + \alpha_{min}(T-25)\}R_{min} \cdot R_{max}]$$

$$\Delta Vs2 = -V_{cc}\{2(T-25)(\alpha_{min} - \alpha_{max})R_{min} \cdot R_{max}\}/ \quad (5)$$
$$[\{1 + \alpha_{min}(T-25)\}R_{min}^2 + \{1 + \alpha_{max}(T-25)\}R_{max}^2 + \{2 + \alpha_{max}(T-25) + \alpha_{min}(T-25)\}R_{min} \cdot R_{max}]$$

Thus, the differential output signal (ΔVs1−ΔVs2) between the voltage changes ΔVs1 and ΔVs2 of the output voltage signals Vs1 and Vs2 of the Wheatstone bridge circuit 1 can be expressed as follows:

$$\Delta Vs1 - \Delta Vs2 = 2V_{cc}\{2(T-25)(\alpha_{min} - \alpha_{max})R_{min} \cdot R_{max}\}/ \quad (6)$$
$$[\{1 + \alpha_{min}(T-25)\}R_{min}^2 + \{1 + \alpha_{max}(T-25)\}R_{max}^2 + \{2 + \alpha_{max}(T-25) + \alpha_{min}(T-25)\}R_{min} \cdot R_{max}]$$

As can be seen from the above expression (6), the differential output signal (ΔVs1−Vs2) which corresponds to the differential amplitude voltage signal V0 of the differential amplifier circuit 2 is subjected to the influence of the nonlinear temperature characteristics of the amplitude voltage signals Vs1 and Vs2 given by quadratic expressions of the minimum resistance value $R_{min}$ and the maximum resistance value $R_{max}$ as a function of change of the ambient temperature.

Such being the circumstances, the differential amplitude voltage signal V0 outputted ultimately from the magnetoresistance type sensor device is subjected to the influence of the temperature characteristics of the individual magnetoresistance elements, which makes it very difficult to effectuate the temperature compensation over the whole range of temperatures to which the Wheatstone bridge circuit 1 is exposed, even when the constant current circuit power source (not shown) is employed, as mentioned previously.

From the above description, it is apparent that the magnetoresistance type sensor device known heretofore suffers from a problem that the temperature compensation is very difficult to effectuate over the whole range of temperatures to which the resistance elements RA to RD are exposed, even when the constant current power source circuit is employed, because of the non-linear temperature characteristics expressed as a quadratic equation of the minimum resistance value $R_{min}$ and the maximum resistance value $R_{max}$ of the magnetoresistance elements RA to RD, respectively, as a function of the ambient temperature T due to the zigzag patterning of the magnetoresistance elements RA to RD symmetrical relative to the center point of the Wheatstone bridge circuit, as shown in FIG. 4.

SUMMARY OF THE INVENTION

In the light of the state of the art described above, it is an object of the present invention to provide a magnetoresistance type sensor device which allows temperature compensation to be effected satisfactorily over a whole range of temperatures to which the magnetoresistance type sensor device is exposed by canceling out temperature characteristics of non-linear amplitude voltage signals derived from the output junctions of a Wheatstone bridge circuit.

In view of the above and other objects which will become apparent as the description proceeds, there is provided according to a first aspect of the present invention a magnetoresistance type sensor device which includes the first to fourth magnetoresistance elements whose resistances change in dependence on an angle of an applied magnetic field and which are interconnected so as to constitute a Wheatstone bridge circuit, and a differential amplifier circuit having inputs for receiving a first potential from a first junction between the first and second magnetoresistance elements and a second potential from a second junction between the third and fourth magnetoresistance elements which are disposed in opposition to the first and second magnetoresistance elements, respectively, to thereby generate a differential amplitude voltage signal indicative of a difference between the first and second potentials, which difference depends on the angle of the applied magnetic field. The magnetoresistance elements are formed of a material having a same composition and dimensioned such that change of the resistance of the first and second magnetoresistance elements brought about by a change in the angle of the applied magnetic field differs from change of the resistance of the third and fourth magnetoresistance elements brought about by the above-mentioned change in the angle of the applied magnetic field, and that the change of the resistance of the first magnetoresistance element is equal to that of the second magnetoresistance element, while the change of resistance of the third magnetoresistance element is equal to that of the fourth magnetoresistance element.

With the arrangement of the magnetoresistance type sensor device described above, the individual magnetoresistance elements have the respective temperature characteristics which coincide with one another, wherein the output potentials from the first and the second junctions of the Wheatstone bridge circuit are inputted to the differential amplifier circuit with the polarities opposite to each other. Consequently, the output signal generated by the differential amplifier circuit and indicating the angle of the applied magnetic field is compensated for in respect to the temperature characteristic over a whole range in which the ambient temperature may vary, to a great advantage.

In a preferred mode for carrying out the invention, the first to fourth magnetoresistance elements may be so dimensioned that the change of the resistance of the first and second magnetoresistance elements as brought about by a change in the angle of the applied magnetic field on one hand and the change of the resistance of the third and fourth magnetoresistance elements brought about by the change in the angle of the applied magnetic field on the other hand differ from each other more than twice inclusive thereof.

By virtue of the arrangement mentioned above, the differential amplitude voltage signal generated by the differential amplifier circuit can enjoy an improved SN ratio.

In another preferred mode for carrying out the invention, the first to fourth magnetoresistance elements may be disposed in such a pattern that in response to a change of the angle of the applied magnetic field, resistances of the first and second magnetoresistance elements change in the directions opposite to each other, respectively, with resistances of the third and fourth magnetoresistance elements charging in the directions opposite to each other, respectively, and that resistances of the first and third magnetoresistance elements connected to each other change in a same direction while resistances of the second and fourth magnetoresistance elements connected to each other change in another same direction.

With the circuit configuration described above, the temperature characteristics of the potential signals appearing at the first and second junctions, respectively, can be canceled out, whereby the differential amplitude voltage signal generated by the differential amplifier circuit can be compensated for in respect to the temperature over the whole range thereof.

In yet another preferred mode for carrying out the invention, the first to fourth magnetoresistance elements may be disposed in such a pattern that the angle of the applied magnetic field is substantially same for both of the first and third magnetoresistance elements and that the angle of the applied magnetic field is substantially same for both of the second and fourth magnetoresistance elements. In that case, the first and third magnetoresistance elements may be disposed on a same planar region so as to extend in parallel with each other, and the second and fourth magnetoresistance elements may be disposed on another same planer region so as to extend in parallel with each other.

Owing to the disposition of the individual magnetoresistance elements mentioned above, variance of the angle of the applied magnetic field among the magnetoresistance elements can be suppressed to a minimum, whereby the magnetoresistance type sensor device can enjoy an enhanced detection capability of the angle of the applied magnetic field.

Further provided according to a second aspect of the present invention is a magnetoresistance type sensor device which includes the first to fourth magnetoresistance elements whose resistances change in dependence on a strength of an applied magnetic field and which are interconnected so as to constitute a Wheatstone bridge circuit, and a differential amplifier circuit having inputs for receiving a first potential from a first junction located between the first and second magnetoresistance elements and a second potential from a second junction located between the third and fourth magnetoresistance elements which are disposed in opposition to the first and second magnetoresistance elements, respectively, to thereby generate a differential amplitude voltage signal indicative of a difference between the first and second potentials, which difference depends on the change of the strength of the applied magnetic field. The magnetoresistance elements are formed of a material having a same composition and dimensioned such that change of the resistance of the first and second magnetoresistance elements brought about by a change in the strength of the applied magnetic field differs from change of the resistance of the third and fourth magnetoresistance elements brought about by the same change of the strength of the applied magnetic field, and that the change of the resistance of the first magnetoresistance element is equal to that of the second magnetoresistance element, while the change of resistance of the third magnetoresistance element connected to each other is equal to that of the fourth magnetoresistance element.

With the arrangement of the magnetoresistance type sensor device described above, the individual magnetoresistance elements have the respective temperature characteristics which are coincide with one another, wherein the output potentials from the first and the second junctions are inputted to the differential amplifier circuit with the polarities opposite to each other. Consequently, the output signal generated by the differential amplifier circuit and indicating the strength of the applied magnetic field is compensated for in respect to the temperature over a whole range thereof, to another great advantage.

In still another preferred mode for carrying out the invention, the first to fourth magnetoresistance elements may be so dimensioned that the change of the resistance of the first and second magnetoresistance elements as brought about by a change in the strength of the applied magnetic field on one hand and the change of the resistance of the third and fourth magnetoresistance elements brought about by the change in the strength of the applied magnetic field on the other hand differ from each other more than twice inclusive thereof.

By virtue of the arrangement mentioned above, the differential amplitude voltage signal generated by the differential amplifier circuit can enjoy an improved SN ratio.

In a further preferred mode for carrying out the invention, the first to fourth magnetoresistance elements may be disposed in such a pattern that in response to a change of the strength of the applied magnetic field, resistances of the first and second magnetoresistance elements change in the directions opposite to each other, respectively, with resistances of the third and fourth magnetoresistance elements changing in the directions opposite to each other, respectively. Resistances of the first and third magnetoresistance elements connected to each other may change in a same direction while resistances of the second and fourth magnetoresistance elements connected mutually change in another same direction.

With the circuit configuration described above, the temperature characteristics of the potential signals appearing at the first and second junctions, respectively, can be canceled out, whereby the differential amplitude voltage signal generated by the differential amplifier circuit can be compensated for in respect to the temperature over the whole range thereof.

In a yet further preferred mode for carrying out the invention, the first to fourth magnetoresistance elements may be disposed in such a pattern that the strength of the applied magnetic field is substantially same for both of the first and third magnetoresistance elements and that the strength of the applied magnetic field is substantially same for both of the second and fourth magnetoresistance elements. The first and third magnetoresistance elements may be disposed on a same planar region so as to extend in parallel with each other, and the second and fourth magnetoresistance elements may be disposed on another same planar region so as to extend in parallel with each other.

Owing to the disposition of the individual magnetoresistance elements mentioned above, variance of the strength of the applied magnetic field from one to another magnetoresistance elements can be suppressed to a minimum, whereby the magnetoresistance type sensor device can enjoy an enhanced detection capability of the strength of the applied magnetic field.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Figure 1:
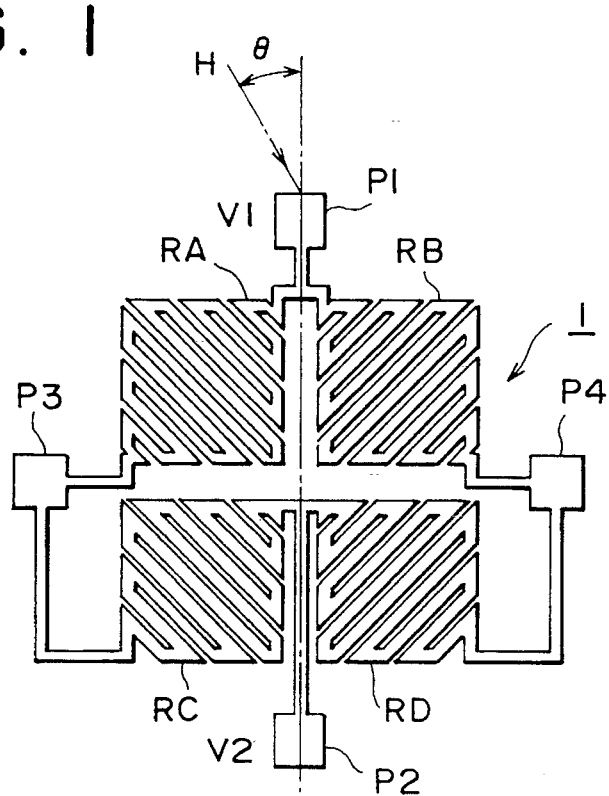
FIG. 1 is a view showing schematically a pattern configuration of a magnetoresistance type sensor device according to a first embodiment of the present invention.

Now, the present invention will be described in detail in conjunction with what is presently considered as preferred or typical embodiments thereof by reference to the drawings. In the following description, like reference characters designate like or corresponding parts throughout the several views. Also in the following description, it is to be understood that such terms as "left", "right", "vertical", "horizontal" and the like are words of convenience and are not to be construed as limiting terms.

Embodiment 1

Figure 3:
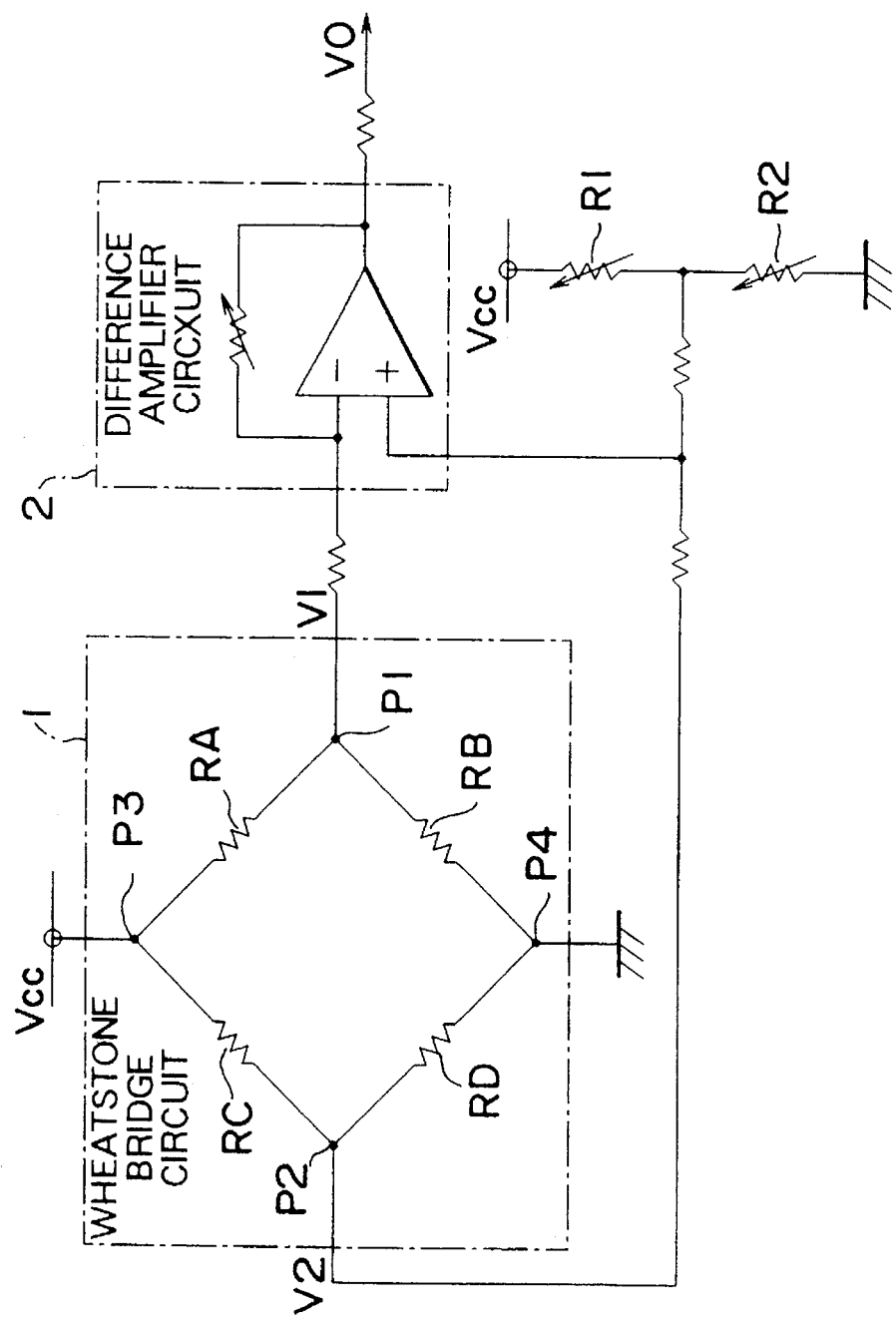
FIG. 3 is a circuit diagram showing a circuit configuration of a conventional magnetoresistance type sensor device known heretofore.
Figure 4:
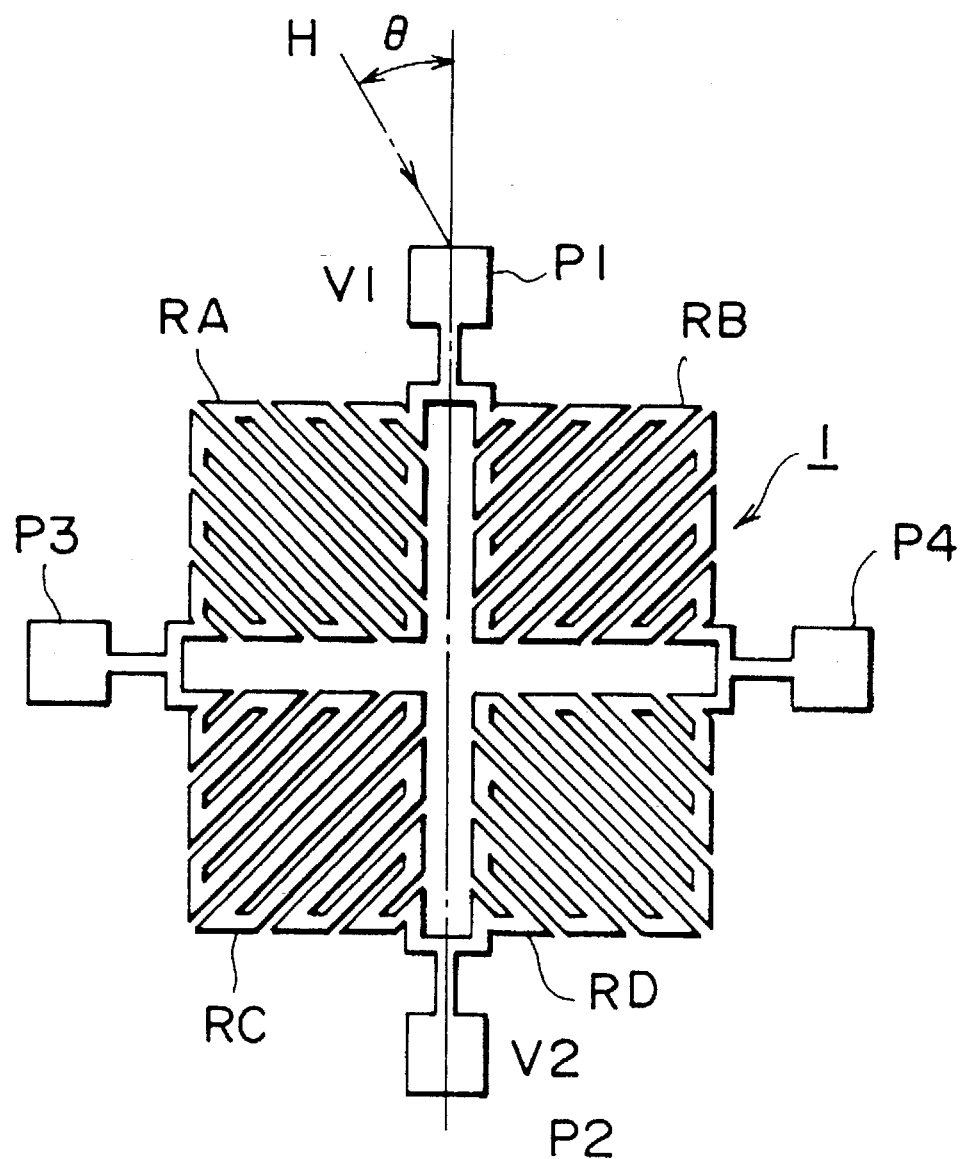
FIG. 4 is a view for illustrating a pattern configuration of a hitherto known magnetoresistance type sensor device together with an applied magnetic field.

A magnetoresistance type sensor device according to a first embodiment of the present invention will be described by reference to FIG. 1 which shows only schematically a pattern configuration of the magnetoresistance type sensor device, wherein reference characters 1, RA to RD, P1 to P4 and θ designate equivalents to those mentioned previously. Further, other circuitries not shown in FIG. 1 may be implemented in a same configuration as shown in FIG. 3.

It should first be pointed out that the magnetoresistance elements RA to RD interconnected in the form of a Wheatstone bridge circuit 1 are constituted by a magnetoresistive material of a same composition having a same temperature characteristic and that these magnetoresistance elements are so disposed that two pairs of the magnetoresistance elements (i.e., RA and RB on one hand and RC and RD on the other hand) exhibit different resistance changes $\Delta R$ $(=R_{max}-R_{min})$ as a function of the angle θ of the applied magnetic field. More specifically, the resistance changes $\Delta RA$ to $\Delta RD$ of the individual magnetoresistance elements RA to RD as a function of the angle θ of the applied magnetic field are so selected or determined as to satisfy the relations given by the following expressions:

$$\Delta RA = \Delta RB \quad \Delta RC = \Delta RD \tag{7}$$

Furthermore, the magnetoresistance elements RA and RB on one hand and the magnetoresistance elements RC and RD on the other hand should preferably be so selected and dimensioned that each of the resistance changes $\Delta RA$ and $\Delta RB$ (where $\Delta RA = \Delta RB$) of the magnetoresistance elements RA and RB is at least twice as large as each of the resistance changes $\Delta RC$ and $\Delta RD$ (where $\Delta RC = \Delta RD$), respectively, i.e., the following relations are satisfied.

$$\Delta RA/\Delta RC \geq 2 \quad \Delta RB/\Delta RD \geq 2 \tag{8}$$

In the magnetoresistance type sensor device having the pattern configuration shown in FIG. 1, the conditions given by the above expression (8) can be satisfied by selecting the stripe widths of the zigzag patterns of the magnetoresistance elements RA and RB connected to the junction P1 of the Wheatstone bridge circuit 1 to be greater than those of the zigzag patterns of the magnetoresistance elements RC and RD connected to the junction P2 so that the resistance changes ΔRC and ΔRD of the magnetoresistance elements RC and RD do not exceed halves (½) of the resistance changes ΔRA and ΔRB of the magnetoresistance elements RA and RB, respectively.

With the arrangement of the magnetoresistance elements RA to RD described above, it is possible to make available a differential amplitude voltage signal V0 of a sufficiently large amplitude with an improved signal-to-noise (SN) ratio.

In this conjunction, it should be noted that in the case of the magnetoresistance type sensor device shown in FIG. 1, although the stripe width of the magnetoresistance elements connected to the second junction P2 is selected greater than that of the magnetoresistance elements connected to the first junction P1, this relation may, of course, be reversed. Furthermore, it should be mentioned that the deviation or difference between the resistance changes ΔRA (=ΔRB) and ΔRC (=ΔRD) may be set rather arbitrarily in consideration of the SN ratio as demanded.

As can be seen from FIG. 1, in the magnetoresistance type sensor device according to the instant embodiment of the invention, the magnetoresistance elements RA, RB, RC and RD are so patterned and oriented that upon application of a magnetic field at the angle θ, the resistances of the magnetoresistance elements RA and RB change in the directions opposite to each other with those of the magnetoresistance elements RC and RD changing also in the opposite directions, respectively, while the resistances of the magnetoresistance elements RA and RC change in the same direction with the resistances of the magnetoresistance elements RB and RD changing equally in the same direction.

By virtue of the patterning and the disposition of the magnetoresistance elements RA to RD described above, the temperature characteristics of the potential signals V1 and V2 derived from the junctions P1 and P2, respectively, are canceled out by the operation of the differential amplifier circuit 2 and thus prohibited from exerting influence to the differential amplitude voltage signal V0 outputted from the differential amplifier circuit 2.

In the following, operation of the magnetoresistance type sensor device according to the instant embodiment of the invention will be elucidated by reference to FIG. 3.

As mentioned previously, when the angle θ of the applied magnetic field changes, the resistance values of the magnetoresistance elements RA to RD vary are caused to change correspondingly, which incurs changes not only in the potential V1 appearing at the junction P1 between the magnetoresistance elements RA and RB but also in the potential V2 at the junction P2 between the magnetoresistance elements RC and RD.

In that case, magnitude ΔRA of the change in the resistance value of the magnetoresistance element RA which is equal to that of the magnetoresistance element RB (i.e., ΔRA=ΔRB) differs from magnitude (ΔRC) of the change in the resistance value of the magnetoresistance element RC which is equal to that of the magnetoresistance element RD (i.e., ΔRC=ΔRD). Consequently, there makes appearance a potential difference ΔV (=V1−V2) between the potential V1 at the junction P1 and the potential V2 at the junction P2. The potential difference ΔV is then amplified by the differential amplifier circuit 2 to be outputted as the differential amplitude voltage signal V0.

At this juncture, let's assume that the angle θ of the magnetic field applied to the magnetoresistance elements RA to RD of the sensor device implemented in the circuit configuration shown in FIG. 3 changes from (−)π/4 to (+)π/4. Then, by taking into account the temperature characteristics, the amplitude voltage signals Vs1 and Vs2 derived from the junctions P1 and P2 can be given by the following expressions (9) and (10) which are similar to the expressions (2) and (3), respectively.

$$Vs1 = V_{cc}[R_{min1}\{1 + \alpha_{min}(T-25)\} - R_{max1}\{1 + \alpha_{max}(T-25)\}]/ \quad (9)$$
$$[R_{min1}\{1 + \alpha_{min}(T-25)\} + R_{max1}\{1 + \alpha_{max}(T-25)\}]$$

$$Vs2 = -V_{cc}[R_{min2}\{1 + \alpha_{min}(T-25)\} - R_{max2}\{1 + \alpha_{max}(T-25)\}]/ \quad (10)$$
$$[R_{min2}\{1 + \alpha_{min}(T-25)\} + R_{max2}\{1 + \alpha_{max}(T-25)\}]$$

where $R_{min1}$ represents a minimum resistance value of the magnetoresistance elements RA and RB, $R_{max1}$ represents a maximum resistance value of the magnetoresistance elements RA and RB, $R_{min2}$ represents a minimum resistance value of the magnetoresistance elements RC and RD, $R_{maxs2}$ represents a maximum resistance value of the magnetoresistance elements RC and RD, $\alpha_{min}$ represents a minimum temperature coefficients of resistance of the magnetoresistance elements RA to RD, $a_{max}$ represents a maximum temperature coefficients of resistance of the magnetoresistance elements RA to RD, and T represents an ambient temperature.

Next, consideration is paid to the temperature characteristics of the amplitude voltage signals Vs1 and Vs2, respectively. When the ambient temperature T changes from the room temperature (e.g. 25° C.) by ΔT (=T−25), a corresponding change ΔVs1 of the amplitude voltage signal Vs1 can be given by the expression (11):

$$\begin{aligned}\Delta Vs1 &= V_{cc}\{2(T-25)(\alpha_{min} - \alpha_{max})R_{min1} \cdot R_{max1}\}/ \quad (11)\\ &\quad [\{1 + \alpha_{min}(T-25)\}R_{min1}^2 + \{1 + \alpha_{max}(T-25)\} \\ &\quad R_{max1}^2 + \{2 + \alpha_{max}(T-25) + \\ &\quad \alpha_{min}(T-25)\}R_{min1} \cdot R_{max1}] \\ &= V_{cc}\{2(T-25)(\alpha_{min} - \alpha_{max})\}/[\{1 + \alpha_{min}(T-25)\} \\ &\quad R_{min1}/R_{max1} + \{1 + \alpha_{max}(T-25)\}R_{max1}/R_{min1} + \\ &\quad \{2 + \alpha_{max}(T-25) + \alpha_{min}(T-25)\}]\end{aligned}$$

In the above expression, magnitude ΔR of the resistance change (i.e., $\Delta R = R_{max} - R_{min}$) is sufficiently small to permit a relation between the minimum resistance value $R_{min1}$ and the maximum resistance value $R_{max1}$ of the magnetoresistance elements RA and RB to be expressed as follows:

$$R_{min1}/R_{max1} = R_{max1}/R_{min1} = 1 \quad (12)$$

From the expression (12), the expression (11) can be rewritten as follows:

$$\Delta Vs1 = V_{cc}\{2(T-25)(\alpha_{min} - \alpha_{max})\}/[\{1 + \alpha_{min}(T-25)\} + \quad (13)$$
$$\{1 + \alpha_{max}(T-25)\} + \{2 + \alpha_{max}(T-25) + \alpha_{min}(T-25)\}]$$

Similarly, a change ΔVs2 in the amplitude voltage signal Vs2 in response to the temperature change ΔT (=T−25) can be given by the following expression (14):

$$\Delta Vs2 = V_{cc}\{2(T-25)(\alpha_{min} - \alpha_{max})\}/[\{1 + \alpha_{min}(T-25)\} + \quad (14)$$
$$\{1 + \alpha_{max}(T-25)\} + \{2 + \alpha_{max}(T-25) + \alpha_{min}(T-25)\}]$$

From the expressions (13) and (14), it can be seen that the change in the ambient temperature as a whole exerts substantially no influence to the relation between the changes in the resistance values of the magnetoresistance elements RA and RC, respectively, as well as the relation between the changes in the resistance values of the magnetoresistance elements RB and RD, respectively, and that the changes ΔVs1 and ΔVs2 in the amplitude voltage signals Vs1 and Vs2 essentially depend on the maximum temperature coefficient $\alpha_{max}$ of resistance and the minimum temperature coefficient $\alpha_{min}$ of resistance which are determined by the compositions of the magnetoresistance elements RA (=RB) and RC (=RD), respectively. At this juncture, it should be recalled that the magnetoresistance elements RA, RB, RC and RD are formed of a material of a same composition. Accordingly, the changes ΔVs1 and ΔVs2 of the amplitude voltage signals Vs1 and Vs2 remain substantially constant over the whole range in which the ambient temperature T may change.

It should further be mentioned that the patterning and disposition of the magnetoresistance elements RA to RD shown in FIG. 1 can be so selected that the relation between the amplitude voltage changes ΔVs1 and ΔVs2 satisfies the condition given by the following expression (15):

$$\Delta Vs1 = \Delta Vs2 \tag{15}$$

In this case, the differential amplitude voltage signal V0 obtained by amplifying difference between the potential V1 at the junction P1 and the potential V2 at the junction P2 can be compensated for in respect to the ambient temperature dependency because the temperature-ascribable changes ΔVs1 and ΔVs2 are canceled out by the differential amplifying function of the circuit 2.

Embodiment 2

Figure 2:
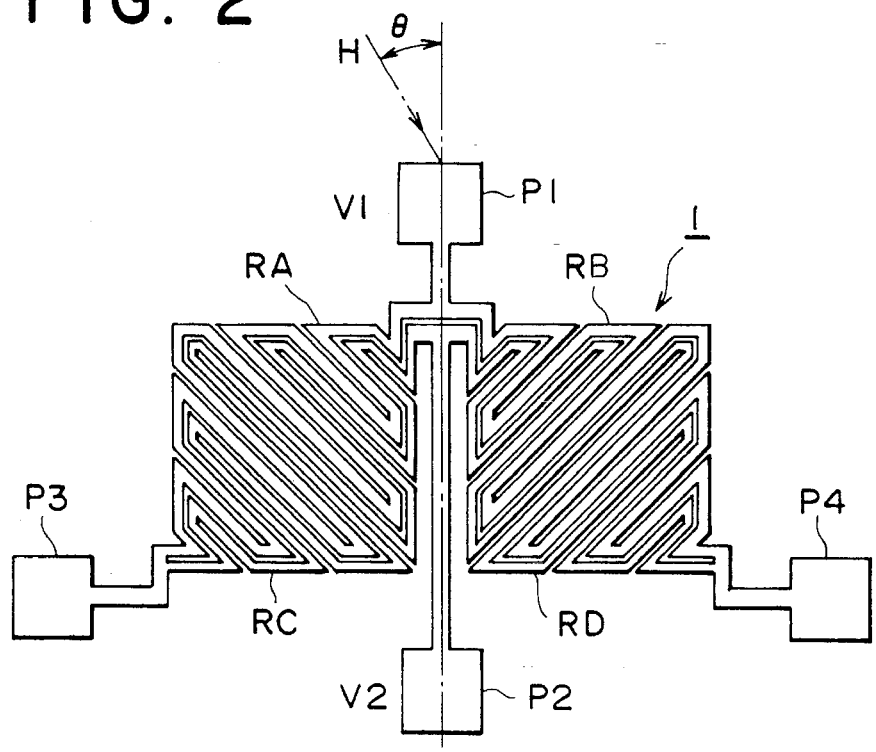
FIG. 2 is a view showing schematically a pattern configuration of a magnetoresistance type sensor device according to a second embodiment of the present invention.

In the case of the magnetoresistance type sensor device according to the first embodiment of the invention, the magnetoresistance elements RA and RC patterned in a same direction are disposed separately and individually with the magnetoresistance elements RB and RD being disposed similarly. By contrast, in the magnetoresistance type sensor device according to a second embodiment of the invention, the magnetoresistance elements RA and RC on one hand and the magnetoresistance elements RB and RD on the other hand extending in an identical stripe pattern are disposed at a same location, being combined in an interdigitally alternating manner, as can be clearly be seen from FIG. 2.

Since the magnetoresistance elements RA and RC are disposed on a same plane in parallel with each other with the magnetoresistance elements RB and RD being disposed similarly, the magnetoresistance elements RA and RC essentially coincide with each in respect to the angle θ of applied magnetic field, which holds true between the magnetoresistance elements RB and RD as well.

Thus, even for the applied magnetic field H whose magnetic fluxes are usually non-parallel, the combined or paired magnetoresistance elements RA and RC or RB and RD can detect the same angle θ of the applied magnetic field, whereby accuracy for the detection of the angle θ of the applied magnetic field on the basis of the differential amplitude voltage signal V0 can further be enhanced.

Of course, operation and effects of the magnetoresistance type sensor device according to the second embodiment invention are essentially same as those of the first embodiment, repeated description of which will thus be unnecessary.

Embodiment 3

In the case of the first and second embodiments of the invention, the differential amplitude voltage signal V0 is detected on the basis of the resistance change ΔR of the magnetoresistance elements RA to RD brought about by the change in the angle θ of the applied magnetic field. However, such arrangement may equally be adopted that the differential amplitude voltage signal V0 is detected on the basis of the resistance changes of the magnetoresistance elements RA to RD which are ascribable to change in the strength of the applied magnetic field H. In that case, it is required to employ the applied magnetic field H of the strength lying within a range in which the magnetoresistance elements RA to RD are not saturated. In this case, the angle θ of the applied magnetic field can be determined on the basis of the differential amplitude voltage signal V0 which changes as a function of change in the strength of the applied magnetic field H, whereby the rotational angle of a member being monitored can be detected with high accuracy and reliability as in the case of the magnetoresistance type sensor devices described hereinbefore in conjunction with the first and second embodiments of the invention.

Many features and advantages of the present invention are apparent form the detailed description and thus it is intended by the appended claims to cover all such features and advantages of the system which fall within the true spirit and scope of the invention. Further, since numerous modifications and combinations will readily occur to those skilled in the art, it is not intended to limit the invention to the exact construction and operation illustrated and described.

By way of example, although the invention has been described in conjunction with detection of an angular position or displacement of a member being monitored such as a steering column of a motor vehicle, it should be understood that the concept of the invention can equally be applied to detection of a linear displacement by interposing an appropriate liner-to-angular displacement translating mechanism or by providing a linear array of permanent magnets in association with the member of concern.

Accordingly, all suitable modifications and equivalents may be resorted to, falling within the spirit and scope of the invention.

What is claimed is:

1. A magnetoresistance sensor device, comprising:

first, second, third and fourth magnetoresistance elements whose resistances change in dependence on an angle of an applied magnetic field and which are interconnected so as to constitute a Wheatstone bridge circuit; and differential amplifier circuit means having inputs for receiving a first potential from a first junction formed between said first and second magnetoresistance elements and a second potential from a second junction formed between said third and fourth magnetoresistance elements which are disposed in opposition to said first and second magnetoresistance elements, respectively, to thereby generate a differential amplitude voltage signal indicative of a difference between said first and second potentials, which difference depends on the angle of said applied magnetic field, said magnetoresistance elements configured such that change of the resistance of said first and second magnetoresistance elements brought about by a change in the angle of said applied magnetic field differs in magnitude from change of the resistance of said third and fourth magnetoresistance elements brought about by said change in the angle of said applied magnetic field, and that said change of the resistance of said first magnetoresistance element is equal to that of said second magnetoresistance element, while said change of resistance of said third magnetoresistance element is equal to that of said fourth magnetoresistance element.

2. A magnetoresistance sensor device according to claim 1, wherein said first to fourth magnetoresistance elements are so dimensioned that the change of the resistance of said first and second magnetoresistance elements as brought about by a change in the angle of said applied magnetic field on one hand and the change of the resistance of said third and fourth magnetoresistance elements brought about by said change in the angle of said applied magnetic field on the other hand differ from each other at least by a factor of two.

3. A magnetoresistance sensor device according to claim 1, wherein said first to fourth magnetoresistance elements are disposed in such a pattern that in response to a change of the angle of said applied magnetic field, resistances of said first and second magnetoresistance elements change in directions opposite to each other, respectively, with resistances of said third and fourth magnetoresistance elements charging in directions opposite to each other, respectively, and wherein resistances of said first and third magnetoresistance elements connected to each other change in a same direction while resistances of said second and fourth magnetoresistance elements connected mutually change in another same direction.

4. A magnetoresistance sensor device according to claim 3, wherein said first to fourth magnetoresistance elements are disposed in such a pattern that the angle of said applied magnetic field is substantially same for both of said first and third magnetoresistance elements and that the angle of said applied magnetic field is substantially same for both of said second and fourth magnetoresistance elements, and wherein said first and third magnetoresistance elements are disposed on a same planar region so as to extend in parallel with each other, and said second and fourth magnetoresistance elements are disposed on another same planar region so as to extend in parallel with each other.

5. A magnetoresistance sensor device, comprising:

first, second, third, and fourth magnetoresistance elements whose resistances change in dependence on a strength of an applied magnetic field and which are interconnected so as to constitute a Wheatstone bridge circuit; and differential amplifier circuit means having inputs for receiving a first potential from a first junction formed between said first and second magnetoresistance elements and a second potential from a second junction formed between said third and fourth magnetoresistance elements which are disposed in opposition to said first and second magnetoresistance elements, respectively, to thereby generate a differential amplitude voltage signal indicative of a difference between said first and second potentials, which difference depends on the strength of said applied magnetic field, said magnetoresistance elements being formed of a material of a same composition and dimensioned such that change of the resistance of said first and second magnetoresistance elements brought about by a change in the strength of said applied magnetic field differs in magnitude from change of the resistance of said third and fourth magnetoresistance elements brought about by said change in the strength of said applied magnetic field, and that said change of the resistance of said first magnetoresistance element is equal to that of said second magnetoresistance element, while said change of resistance of said third magnetoresistance element connected mutually is equal to that of said fourth magnetoresistance element.

6. A magnetoresistance sensor device according to claim 5, wherein said first to fourth magnetoresistance elements are so dimensioned that the change of the resistance of said first and second magnetoresistance elements as brought about by a change in the strength of said applied magnetic field on one hand and the change of the resistance of said third and fourth magnetoresistance elements brought about by said change in the strength of said applied magnetic field on the other hand differ from each other at least by a factor of two.

7. A magnetoresistance sensor device according to claim 5, wherein said first to fourth magnetoresistance elements are disposed in such a pattern that in response to a change of the strength of said applied magnetic field, resistances of said first and second magnetoresistance elements change in directions opposite to each other, respectively, with resistances of said third and fourth magnetoresistance elements charging in directions opposite to each other, respectively, and wherein resistances of said first and third magnetoresistance elements connected to each other change in a same direction while resistances of said second and fourth magnetoresistance elements connected mutually change in another same direction.

8. A magnetoresistance sensor device according to claim 7, wherein said first to fourth magnetoresistance elements are disposed in such a pattern that the strength of said applied magnetic field is substantially same for both of said first and third magnetoresistance elements and that the strength of said applied magnetic field is substantially same for both of said second and fourth magnetoresistance elements, and wherein said first and third magnetoresistance elements are disposed on a same planar region so as to extend in parallel with each other, and said second and fourth magnetoresistance elements are disposed on another same planar region so as to extend in parallel with each other.

* * * * *